(12) United States Patent
Lee et al.

(10) Patent No.: US 9,504,159 B2
(45) Date of Patent: Nov. 22, 2016

(54) CIRCUIT COMPONENT BRIDGE DEVICE

(71) Applicant: INTEL CORPORATION, Santa Clara, CA (US)

(72) Inventors: Beom-Taek Lee, Mountain View, CA (US); Raul Enriquez-Shibayama, Zapopan (MX); Carolina Garcia Robles, Tlaquepaque (MX)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 14/169,423

(22) Filed: Jan. 31, 2014

(65) Prior Publication Data
US 2015/0223336 A1   Aug. 6, 2015

(51) Int. Cl.
| | |
|---|---|
| *H05K 1/11* | (2006.01) |
| *H05K 1/18* | (2006.01) |
| *H05K 1/02* | (2006.01) |
| *H05K 3/40* | (2006.01) |
| *H05K 1/14* | (2006.01) |
| *H05K 3/34* | (2006.01) |

(52) U.S. Cl.
CPC ............ *H05K 1/18* (2013.01); *H05K 1/0216* (2013.01); *H05K 1/0245* (2013.01); *H05K 1/0251* (2013.01); *H05K 1/115* (2013.01); *H05K 3/4007* (2013.01); *H05K 3/4038* (2013.01); *H05K 1/144* (2013.01); *H05K 3/3436* (2013.01); *H05K 2201/10734* (2013.01); *H05K 2203/1461* (2013.01); *Y10T 29/49165* (2015.01)

(58) Field of Classification Search
CPC .............................. H05K 1/144; H05K 3/429
USPC .................................................. 174/261, 262
See application file for complete search history.

(56) References Cited

U.S. PATENT DOCUMENTS

| | | | | |
|---|---|---|---|---|
| 5,783,865 | A * | 7/1998 | Higashiguchi | .......... H01L 23/13 257/774 |
| 6,992,899 | B2 * | 1/2006 | Alger | ..................... H05K 1/141 174/260 |
| 2001/0040051 | A1 * | 11/2001 | Lipponen | .................. H01P 3/06 174/262 |
| 2008/0283285 | A1 * | 11/2008 | Frech | ........................ G06F 1/10 174/261 |

* cited by examiner

*Primary Examiner* — Chau N Nguyen
(74) *Attorney, Agent, or Firm* — International IP Law Group, P.L.L.C.

(57) ABSTRACT

A bridge device is described herein. The bridge device may include a first via of a bridge device, the first via of the bridge device having a short via stub or no via stub, the first via of the bridge device to be communicatively coupled to a first via of a printed circuit board (PCB). The bridge device may include a second via of the bridge device, the second via of the bridge device having a short via stub or no via stub, the second via of the bridge device to be communicatively coupled to a second via of the PCB. A trace of the bridge device may communicatively couple the first via of the bridge device to the second via of the bridge device.

14 Claims, 7 Drawing Sheets

CIRCUIT COMPONENT BRIDGE DEVICE

TECHNICAL FIELD

This disclosure relates generally to techniques for circuit components having a bridge device. Specifically, this disclosure relates to a bridge device to couple to a printed circuit board.

BACKGROUND ART

Computing systems may include devices such as a printed circuit board (PCB) having input/output bus connections. As input/output (I/O) speeds increase, channel loss, such as return loss and insertion loss associated with impedance discontinuities become a bottle-neck of the bus performance. In some scenarios, impedance discontinuities occur due to traces connecting to via stubs. A via stub is a portion of a via wherein the portion is not a main propagation path, or is not an intended propagation path. While the via may be designed to propagate a signal, connections between a via and other components, such as a trace, may leave a stub of the via that may cause a reflection of the propagating signal. Via discontinuities may arise from reflections of a signal due to the unused portion of the long via stub.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

The present disclosure relates generally to a bridge device to communicatively couple to a printed circuit board. As discussed above, a PCB via stub is a factor limiting I/O bus performance. The techniques discussed herein include the use of a bridge device having vias with short or no via stubs. In this manner, the use of longer via stubs, in relation to the short via stubs or no via stubs of a bridge device, may be reduced by propagating a signal through the bridge device having.

As discussed above, a via stub is a portion of the via that is not a part of a main propagation path of a signal propagating through a circuit component. Whether a via stub is long or short, as referred to herein, is defined by a relationship between the resonance frequency associated with the via stub in comparison to a Nyquist frequency associated with the propagating signal. The Nyquist frequency of the signal is ½ the sampling rate of the propagating signal. A long via stub is a stub having a resonance frequency that is less than or equal to the product of a multiplication factor and the Nyquist frequency. In embodiments, a long via stub is a via stub having a resonance frequency that is less than or equal to 4 times the Nyquist frequency of a signal propagating through the via having the via stub. In embodiments, a short via stub is a via stub having a resonance frequency that is greater than 4 times the Nyquist frequency of a signal propagating through the via having the via stub.

Figure 1A:
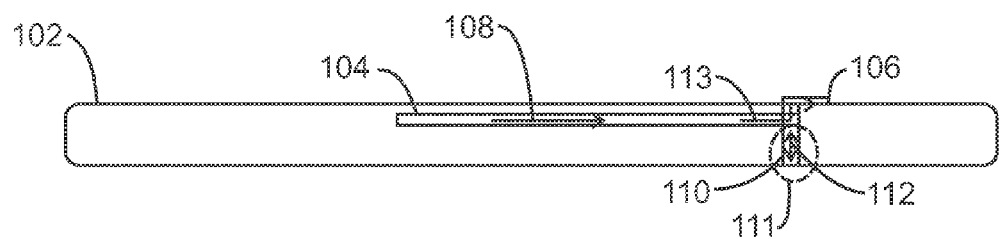
FIG. 1A is a diagram illustrating a side view of an example circuit component having no bridge device.

FIG. 1A is a diagram illustrating a side view of an example circuit component having no bridge device. The circuit component 102 may be a PCB having a trace 104 to provide a signal to an output contact 106. The signal propagating through the trace 104, as indicated by the arrow 108, may be provided to the output contact 106 through a via 110. As indicated by the arrow 112, the signal may propagate through a stub, indicated by the dashed box 111, of the via 110 that is not a part of the main propagation path as indicated by the arrow 113. The propagation of the signal at 112 through the via stub 111 may cause an impedance discontinuity in the circuit component 102 if the resonance frequency of the via stub 111 is less than or equal to 4 times the Nyquist frequency. The embodiments described herein include a bridge device wherein a signal may propagate through vias of the bridge device rather than a via of the circuit component, such as the via 110 FIG. 1A, having long a via stub 111.

Figure 1B:
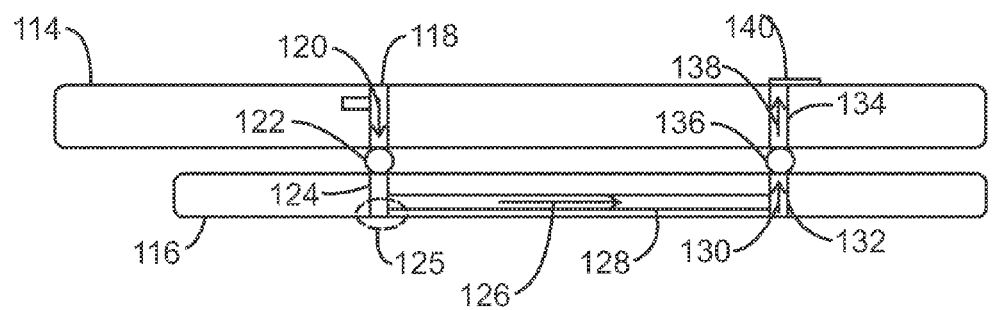
FIG. 1B is a diagram illustrating a side view of an example circuit component having a bridge device.

FIG. 1B is a diagram illustrating a side view of an example circuit component having a bridge device. The circuit component 114 may be a PCB, similar to the circuit component 102 of FIG. 1A. In contrast to FIG. 1A, the circuit component 114 may be communicatively coupled to a bridge device 116. A signal may propagate through a first via 118 of the circuit component 114 as indicated by the arrow 120. A contact 122 may communicatively couple the first via 118 to a first via 124 of the bridge device 116. In embodiments, the contact 122 is a ball grid array contacts, however, the contact 122 may be any suitable contact or connector configured to communicatively couple circuit components. The first via 124 of the bridge device 116 may include a via stub as indicated by the dashed circle 125. In comparison to the via stub 111, the via stub 125 be relatively shorter such that a resonance frequency of the via stub 125 is greater than the Nyquist frequency of the propagating signal times a multiplier.

In embodiments, when a signal propagates through the via 124 having a short via stub 125 a reflection of the signal that may otherwise occur may be reduced. A reflection of the propagating signal occurs wherein the signal propagates in an opposite direction. In some embodiments, the short stub 125 of the bridge device 116 may be removed. For example, the short stub 125 of the bridge device 116 may be removed by mechanical drilling, laser drilling, and the like. Other short via stubs of the bridge device may also be removed in a similar manner.

At 126, the signal may propagate through a trace 128 of the bridge device 116. At 130, the signal may propagate through a second via 132 of the bridge device 116. The second via 132 of the bridge device 116 may be communicatively coupled to a second via 134 of the circuit component 114 through a contact 136, similar to the contact 122. In embodiments, the signal may propagate at 138 to an output contact 140. As illustrated in FIG. 1B, the second via 132 of the bridge device 116 may include a short via stub, similar to the short via stub 125 of the first via 124 of the bridge device 116. The coupling of the bridge device 116 to the circuit component 114 may reduce reflections of impedance discontinuities as the signals propagate through vias having short, or even no via stubs. A reduction in impedance discontinuities of propagating signals may result in with a reduction in reflections of the propagating signals associated with long via stubs, as discussed above.

Figure 2:
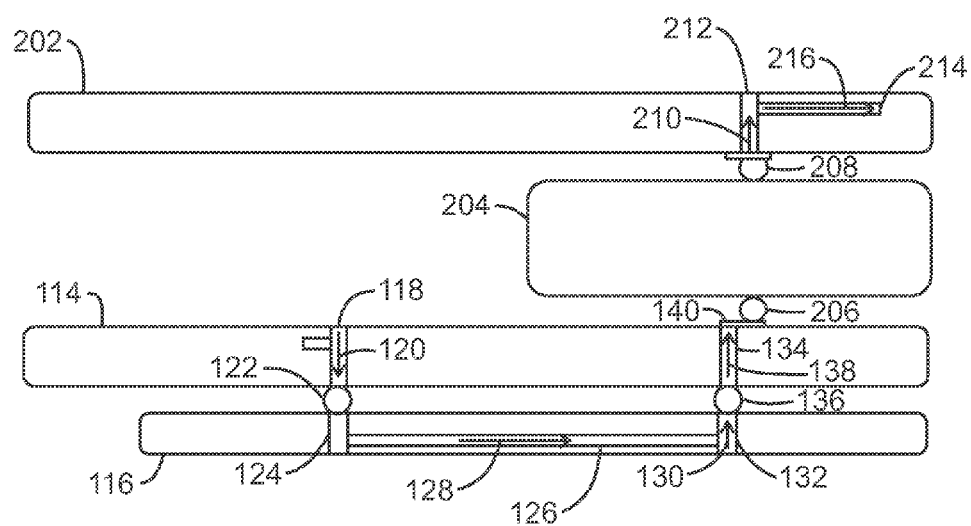
FIG. 2 is a diagram illustrating a side view of circuit components having a bridge device in an example embodiment.

FIG. 2 is a diagram illustrating a side view of circuit components having a bridge device in an example embodiment. The bridge device 114 may be used in a circuit component system, such as the circuit component system 200. As illustrated in FIG. 2, the circuit component 114 may be a first PCB, and may be communicatively coupled to a second PCB 202 through a mezzanine connector 204. The mezzanine connector 204 is one example of a connector that may be used to communicatively couple the first PCB 114 to the second PCB 202. The example illustrated in FIG. 2 includes contacts 206, 208 to communicatively couple the first PCB 114 and the second PCB 202. As illustrated at 210, the signal may propagate at 210 through a via 212 of the second PCB 202, and ultimately through an output trace 214 as indicated by the arrow 216.

Figure 3:
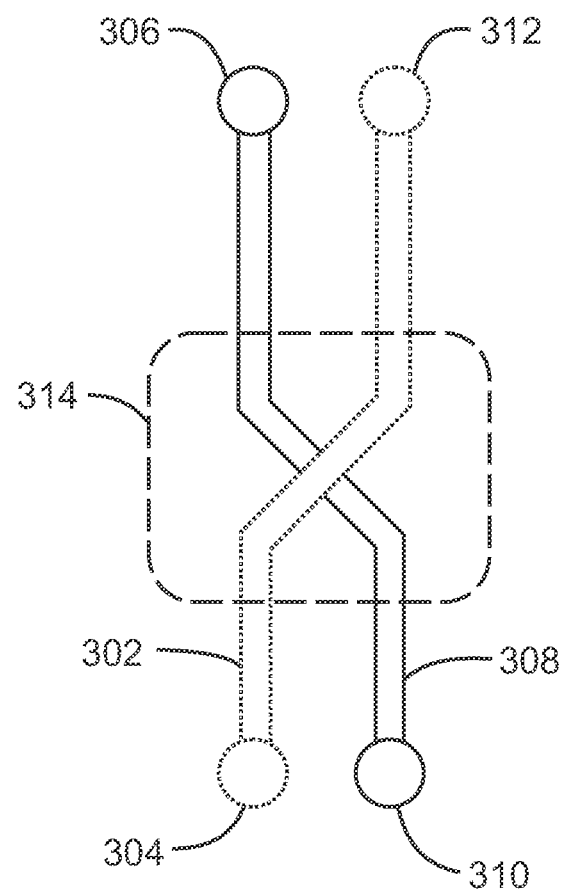
FIG. 3 illustrates a top view of an example crosstalk reduction mechanism implemented in the bridge device.

FIG. 3 illustrates a top view of an example crosstalk reduction mechanism implemented in the bridge device. As discussed above in reference to FIG. 1A and FIG. 2, the signal may propagate through a trace, such as the trace 126 discussed above. In some embodiments the trace of the bridge device may be configured to propagate a single ended signal. In some embodiments, the trace may be configured to propagate a differential signal. In this embodiment, the bridge device 116 of FIG. 1A and/or FIG. 2 may include two traces configured to propagate a differential signal.

As illustrated in FIG. 3, the traces may include a first trace 302 connecting vias 304, 306 of a bridge device, such as the bridge device 116 of FIG. 1B. A second trace 308 connects vias of the bridge device indicated at 310 and 312. In some embodiments, the first trace 302 and the second trace 308 may be disposed such that their polarity is inverted as indicated by the dashed box 314. The dashed box 314 may invert the polarity of signals propagating through the traces 302 and 308 such that crosstalk between the bridge device 116 and the circuit component 114 may be reduced. In other words, the bridge device 116 and the circuit component 114 may experience crosstalk wherein the polarity inversion at the traces 302 and 308 may reduce the crosstalk by introduction of crosstalk having opposite polarity in the bridge device 116. In embodiments, the traces 302 and 308 may each include a transition at 314 wherein paths of the traces 302 and 308 are crossed. The transition of 314 may be implemented by disposing the first trace 302 at a first depth of the bridge device 116 and the second trace 308 at a second depth of the bridge device 116.

Figure 4:
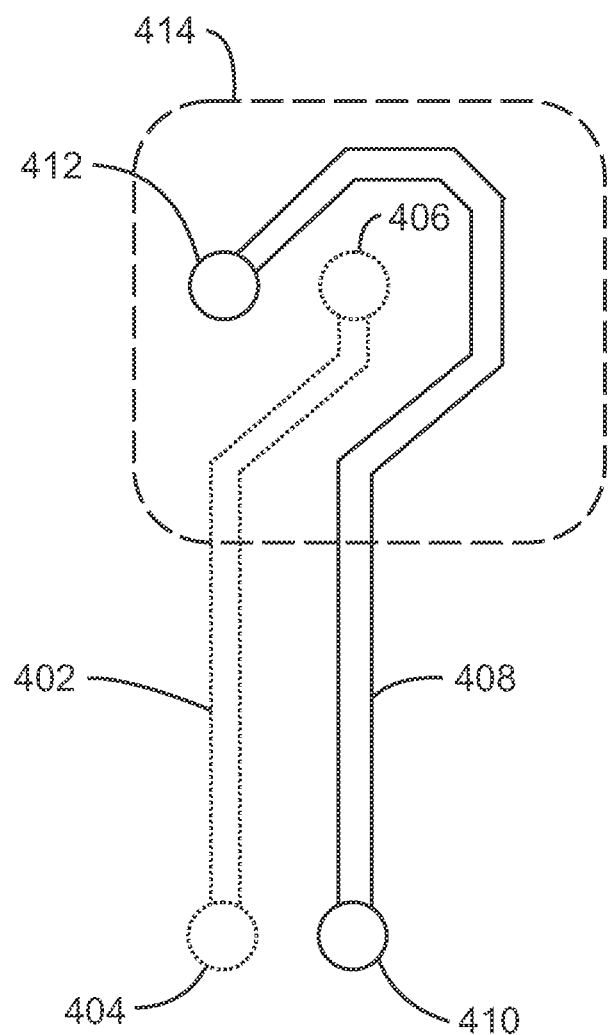
FIG. 4 illustrates a top view of an alternative example crosstalk reduction mechanism implemented in the bridge device

FIG. 4 illustrates a top view of an alternative example crosstalk reduction mechanism implemented in the bridge device. In comparison to the example mechanism discussed in FIG. 3, crosstalk may be reduced by inversion polarity without the transition 314 discussed above. As illustrated in FIG. 4, a first trace 402 may communicatively couple vias of the bridge device indicated at 404 and 406. A second trace 408 may communicatively couple vias of the bridge device indicated at 410 and 412. The traces 402 and 408 may introduce polarity inversion by transitions of the first trace 402 and the second trace 404 wherein one end of a trace is sufficiently surrounded by another trace as indicated by the dashed box 414. In this embodiment, the first trace 402 and the second trace 408 are disposed at equal depths, rather than being disposed at different depths as discussed above in reference to FIG. 3. As discussed above, in some embodiments, the bridge device 116 may be implemented to propagate a single-ended signal. In that scenario, the crosstalk reduction mechanism in FIG. 3 and FIG. 4 may not be applicable.

Figure 5A:
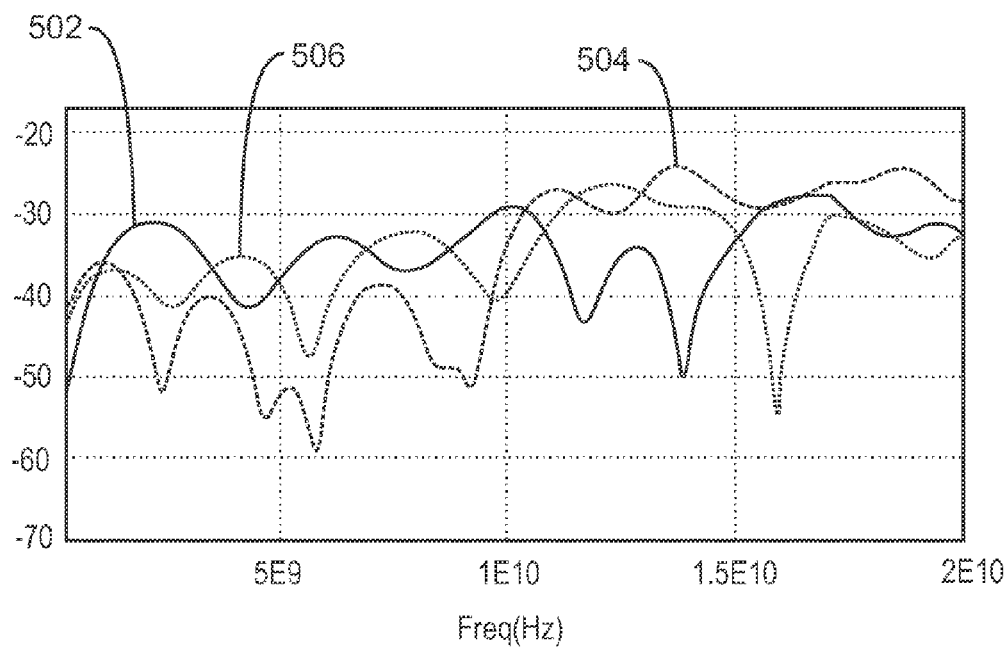
FIG. 5A and FIG. 5B are graphs illustrating crosstalk reduction.
Figure 5B:
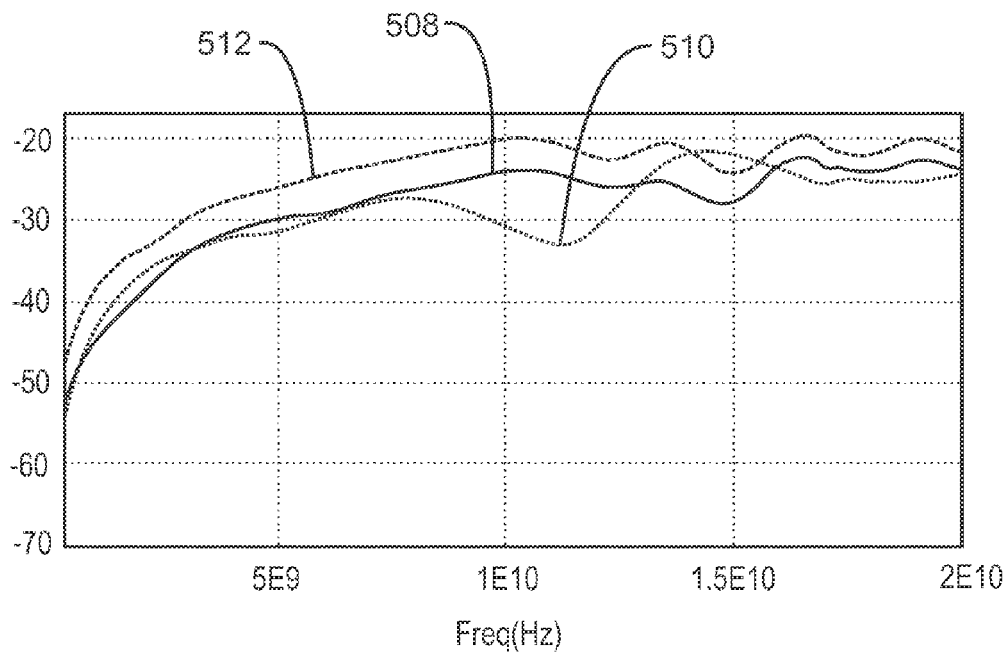

FIG. 5A and FIG. 5B are graphs illustrating crosstalk reduction. At FIG. 5A, the near-end crosstalk of a circuit component having a bridge device, such as the bridge device 116 of FIG. 1B, and having polarity inversion as discussed above in relation to FIG. 3 and/or FIG. 4, is indicated at 502. The near-end cross talk of a circuit component having the bridge device 116 implemented without polarity inversion is indicated at 504. Further, the near-end crosstalk of a circuit component having no bridge device is indicated at 506. As illustrated in FIG. 5A, the near-end cross talk of a bridge device 116 having no polarity inversion may be reduced by implementing polarity inversion. In FIG. 6, the far-end cross talk of a circuit component having a bridge device 116 implementing polarity inversion is indicated at 508, a bridge device without polarity inversion is indicated at 510, and a circuit component having no bridge device is indicated at 512.

As illustrated in FIG. 5A and/or FIG. 5B, the implementation of a bridge device may increase both near-end and far-end crosstalk. However, the implementation of a bridge device having polarity inversion as discussed above, may reduce crosstalk between the bridge device and the circuit component to which it is communicatively coupled.

Figure 6A:
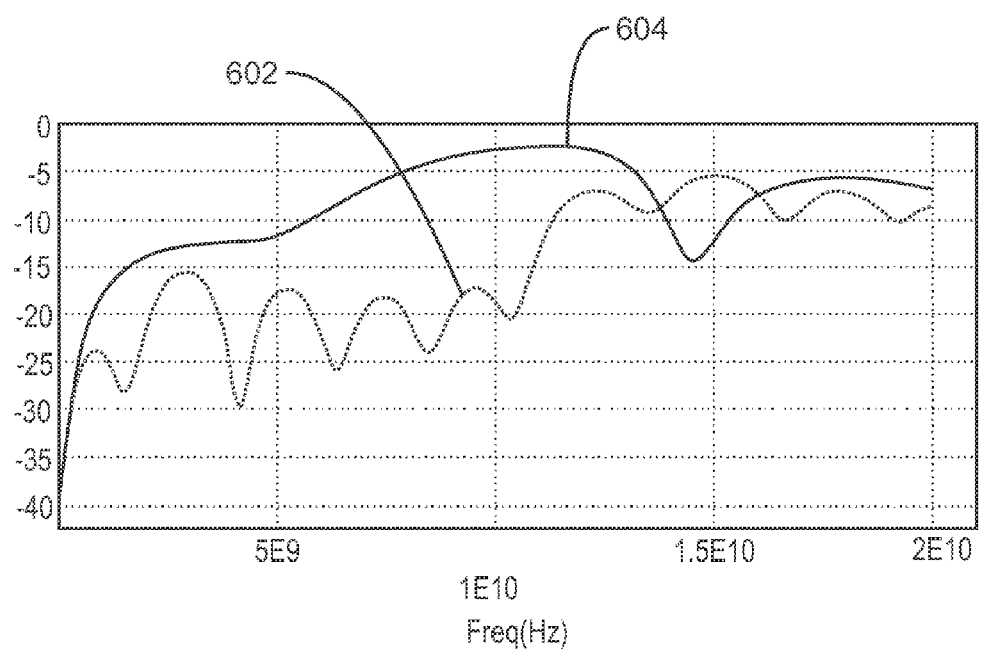
FIG. 6A and FIG. 6B are graphs illustrating signal loss reduction.
Figure 6B:
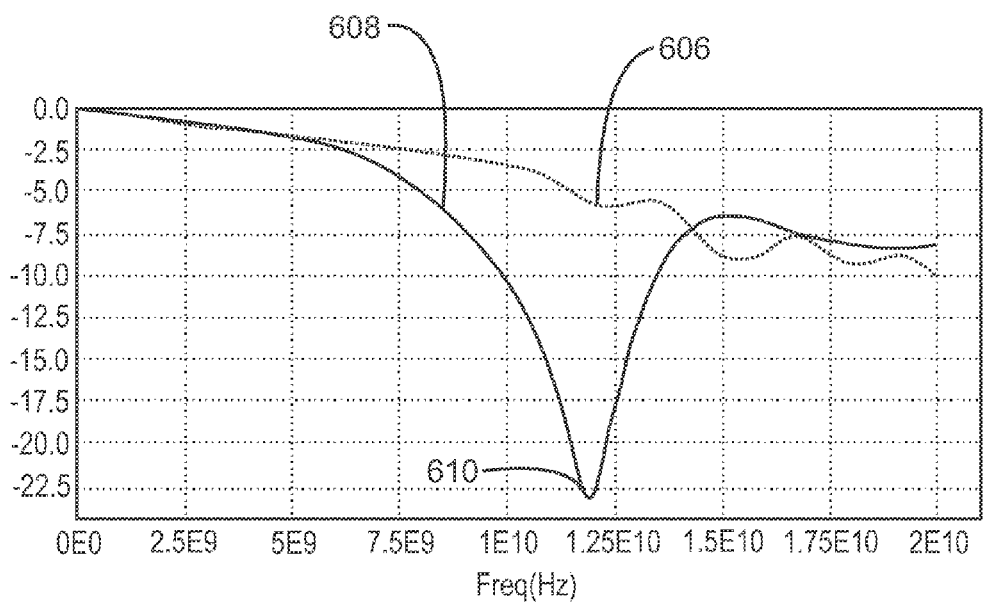

FIG. 6A and FIG. 6B are graphs illustrating signal loss reduction. In FIG. 6A, the line 602 indicates the return loss of a circuit component, such as the circuit component 114 of FIG. 1B having a bridge device 114. A circuit component having no bridge device is indicated by the line 604. In FIG. 6B, the line 606 indicates the insertion loss of a circuit component having a bridge device, such as the bridge device 114 of FIG. 1B. A circuit component having no bridge device is indicated by the line 608.

As illustrated in FIGS. 6A and 6B, the return loss of a circuit component having a bridge device is improved compared to a circuit component not having a bridge device. Further, the circuit component not having a bridge device suffers from a dip at 610, wherein the dip 610 is associated with the resonance frequency of a long via stub, such as the long via stub 111 of FIG. 1A.

Figure 7:
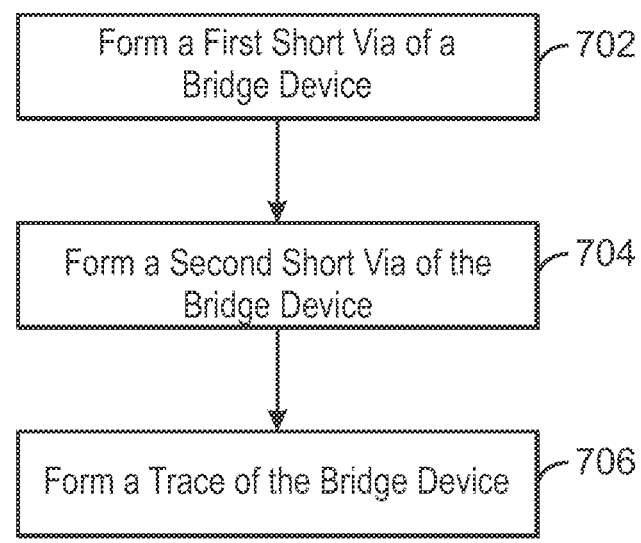
FIG. 7 is a block diagram illustrating a method of forming a circuit component having a bridge device.

FIG. 7 is a block diagram illustrating a method of forming a circuit component having a bridge device. At 702 a first short via may be formed. The first short via may be formed in a bridge device to be communicatively coupled to a first long via of a PCB. At 704, a second short via may be formed. The second short via may be formed in the bridge device. As discussed above, the first and second short vias may be short in comparison to long vias of the PCB. At 706, a trace is formed to communicatively couple the first short via to the second short via.

The bridge device may enable a reduction of impedance discontinuity that may otherwise occur without the use of the bridge device. Specifically, by propagating the signal through the first long via of the PCB through the bridge device, the propagation of the signal through long via stubs associated with impedance discontinuities may be reduced or avoided.

In embodiments, the method 700 may include forming a connector to communicatively couple the bridge device to the PCB. For example, the connector may be solder ball associated with a ball grid array. Other connectors may include a pin of a pin grid array, or any suitable connector.

The reduction of impedance discontinuities may also affect other performance parameters. For example, in some embodiments, a return loss of a signal propagating through a circuit component including the bridge device may be reduced. As another example, insertion loss may also be reduced.

Example 1

A method of forming a bridge device is described herein. A first via of the bridge device may be formed having a short via stub, or no via stub. The first via of the bridge device is to be communicatively coupled to a first via of a printed circuit board. The method may include forming a second via of the bridge device. Similar to the first via, the second via may be formed such that the second via includes a short or no via stub. The second via of the bridge device is to be communicatively coupled to a second via of the printed circuit board.

In some embodiments, the method may include a bridging means. Examples of the bridging means may include the bridging device discussed above. The bridging means may reduce impedance discontinuities propagating from the printed circuit board through the bridging means.

Example 2

A bridging device is described herein. The bridging device may include a first via of the bridge device and a second via of the bridging device. The first and second via of the bridge device may include a short via, or no via. A trace of the bridging device may communicatively couple the first via to the second via of the bridging device such that a signal may propagate from a printed circuit board through the bridging device.

In some embodiments, a bridging means is described herein. The bridging means may include the first via, the second via, and the trace of the bridging device discussed above.

Example 3

A circuit component system is described herein. The circuit component system may include a first via and second via of a printed circuit board. The circuit component system may also include a bridging means, such as a bridging device, having a first via, a second via, and a trace to communicatively couple to the printed circuit board. The vias of the bridging means may include short, or no vias, such that a signal propagating through the bridging means may reduce impedance discontinuities rather than by propagating through a printed circuit board having long vias.

Example 4

A bridging means is described herein.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. A bridge device, comprising:
 a first via of a bridge device, the first via of the bridge device having a short via stub or no via stub, the first via of the bridge device to be communicatively coupled to a first via of a printed circuit board (PCB);
 a second via of the bridge device, the second via of the bridge device having a short via stub or no via stub, the second via of the bridge device to be communicatively coupled to a second via of the PCB; and
 a trace of the bridge device to communicatively couple the first via of the bridge device to the second via of the bridge device, wherein each of the short via stubs is defined as a portion of a via having a resonance frequency that is higher than a Nyquist frequency multiplied by a multiplier that is greater than one.

2. The bridge device of claim 1, wherein an impedance discontinuity of a signal is reduced by propagating the signal from the PCB through the first via bridge device, the trace, and the second via of the bridge device.

3. The bridge device of claim 1, comprising a connecting mechanism to communicatively couple the bridge device to the PCB at the vias.

4. The bridge device of claim 3, wherein the connecting mechanism is a solder connecting mechanism of a ball grid array or any viable connecting mechanism.

5. The bridge device of claim 1, wherein a return loss of a signal is reduced by propagating the signal from the PCB through the first via of the bridge device, the trace, and the second via of the bridge device.

6. The bridge device of claim 1, wherein the trace of the bridge device is a first trace, comprising a second trace such that differential signal pairs may propagate through the bridge device.

7. The bridge device of claim 6, wherein a polarity of the differential signals is inversed at the bridge device in comparison to a polarity of differential signals at the PCB such that crosstalk between the bridge device and the PCB is reduced.

8. The bridge device of claim 1, wherein the trace of the bridge device is a first trace, comprising a second trace such that single-ended signal may propagate through the bridge device.

9. A circuit component system, comprising:
a printed circuit board (PCB) having a first via and a second via;
a first via of a bridge device to be communicatively coupled to the first via of the PCB, the first via of the bridge device having a short via stub or no via stub;
a second via of the bridge device to be communicatively coupled to the second via of the PCB, the second via of the bridge device having a short via stub or no via stub; and a trace of the bridge device to communicatively couple the first via of the bridge device to the second via of the bridge device, wherein each of the short via stubs is defined as a portion of a via having a resonance frequency that is higher than a Nyquist frequency multiplied by a multiplier that is greater than one.

10. The circuit component system of claim 9, wherein an impedance discontinuity of a signal is reduced by propagating the signal from the PCB through the first short via, the trace, and the second short via of the bridge device.

11. The circuit component system of claim 9, comprising a connecting mechanism to communicatively couple the bridge device to the PCB at the vias.

12. The circuit component system of claim 11, wherein the connecting mechanism is a solder connecting mechanism of a ball grid array or any viable connecting mechanism.

13. The circuit component system of claim 9, wherein a return loss of a signal is reduced by propagating the signal from the PCB through the first via of the bridge device, the trace, and the second via of the bridge device.

14. The circuit component system of claim 9, wherein the trace of the bridge device is a first trace, comprising a second trace of the bridge device; such that:
a polarity of differential signals propagating through the bridge device is inversed at the bridge device in comparison to a polarity of differential signals at the PCB such that crosstalk between the bridge device and the PCB is reduced;
single-ended signal may propagate through the bridge device; or
any combination thereof.

* * * * *